(12) United States Patent
Yeh

(10) Patent No.: US 7,567,643 B2
(45) Date of Patent: Jul. 28, 2009

(54) PHASE LOCK LOOP DEVICE

(75) Inventor: Tse-Hsien Yeh, Taipei (TW)

(73) Assignee: Via Technologies, Inc., Taipei (TW)

( * ) Notice: Subject to any disclaimer, the term of this patent is extended or adjusted under 35 U.S.C. 154(b) by 615 days.

(21) Appl. No.: 11/298,038

(22) Filed: Dec. 9, 2005

(65) Prior Publication Data

US 2006/0125537 A1      Jun. 15, 2006

Related U.S. Application Data

(60) Provisional application No. 60/635,340, filed on Dec. 10, 2004.

(30) Foreign Application Priority Data

Nov. 14, 2005     (TW) .............................. 94139891 A

(51) Int. Cl.
*H03D 3/24* (2006.01)
(52) U.S. Cl. .................. 375/376; 375/371; 375/372; 375/373; 375/374; 375/375; 375/354; 331/16; 331/17; 331/11; 327/156; 327/157; 327/159

(58) Field of Classification Search ......... 375/371–376, 375/354; 331/16–17, 11; 327/156, 157, 327/159
See application file for complete search history.

(56) References Cited

U.S. PATENT DOCUMENTS 6,993,108 B1 *    1/2006   Chi et al. .................. 375/376
2004/0051592 A1 *  3/2004  Ho et al. ...................... 331/17

* cited by examiner

*Primary Examiner*—Mohammad H Ghayour
*Assistant Examiner*—Zewdu Kassa
(74) *Attorney, Agent, or Firm*—Thomas, Kayden, Horstemeyer & Risley

(57) ABSTRACT

A phase lock loop device further includes a probability shaping device provided between a phase detection device and charge pump and loop filter (CPLF) device. The probability shaping device operates to reduce the frequency of outputting up-index or down-index; thereby shaping probability distribution to reduce degradation due to mismatching of the CPLF device.

11 Claims, 12 Drawing Sheets

PHASE LOCK LOOP DEVICE

CROSS REFERENCE TO RELATED APPILCATIONS

This application claims the benefit of U.S. Provisional Application No. 60/635,340 filed Dec. 10, 2004.

BACKGROUND OF THE INVENTION

1. Field of the Invention

The present invention relates to a phase lock loop device, and in particular relates to a phase lock loop device capable of alleviating degradation due to charge pump mismatch.

2. Description of the Related Art

FIG. 1 is a function block diagram showing a conventional phase lock loop (PLL) device 100 for carrying out data clock recovery. The PLL device 100 comprises a phase detection (PD) device 102, a charge pump and loop filter (CPLF) device 104, a voltage control oscillator (VCO) 106 and a D-type flip-flop (DFF) 108.

The phase detection device 102 detects the transition of each input data datain, outputting an up-index UP when the transition edge of the input data leads a clock signal CK and outputting a down-index DN when the transition edge of the input data lags the feed-back clock signal CK. If there is no phase difference between the input data datain and the clock signal CK, the phase detection device 102 doesn't output up-index UP or down-index DN. Generally, the clock signal CK general is fed back to the phase detection device 102 through a division device (not shown in FIG. 1), and here the division device is supposed to carry out a divide-by-one operation for brevity.

The CPLF device 104 comprises a charge pump and a loop filter (both not shown in FIG. 1), implemented by current switches, resistors, capacitors or active devices. The function of the CPLF device 104 can be analyzed as a combination of a proportional path CP1 and an integration path CP2, and the combination may be an adding operation. The CPLF device 104 adjusts its output voltage Vc according to the received up-index UP or down-index DN.

The VCO 106 outputs the clock signal CK and changes the frequency of the clock signal CK according to the voltage Vc outputted from the CPLF device 104.

The D-type flip-flop 108 samples the input data datain according to the clock signal CK, and outputs the data dataout.

Gain mismatching of internal circuitry is unavoidable when implementing the charge pump in the CPLF device 104, and therefore the PLL device 100 can not ideally lock the clock signal CK when performing data clock recovery.

BRIEF SUMMARY OF INVENTION

The invention is directed to a phase lock loop (PLL) device capable of alleviating degradation due to gain mismatching of charge pump.

The feature of the PLL device is that a probability shaping device is further disposed between a phase detection device and a charge pump and loop filter (CPLF) device to effectively alleviate degradation resulting from gain mismatching of charge pump.

To achieve the above object, one exemplary embodiment of the invention provides a PLL device comprising a phase detection device coupled to an input data signal and a clock signal to detect the phase difference between the input data signal and the clock signal and to output a first up-index (UP1) or a first down-index (DN1); a probability shaping device coupled to the output of the phase detection device to process the first up-index and first down-index and output a second up-index (UP2) or a second down-index (DN2); a charge pump and loop filter (CPLF) device coupled to the probability shaping device to output and adjust a control voltage according to the second up-index or second down-index received by the CPLF device; and a voltage control oscillator coupled to the control voltage to change frequency or phase of the clock signal according to the control voltage and output the clock signal to the phase detection device. It is noted that the probability shaping device is designed to lower the expected values (E(UP2) and E(DN2)) of the second up-index (UP2) and second down-index (DN2), whereby the distribution of the expected values (E(UP2) and E(DN2)) corresponding to the phase position detected by the phase detection device is well shaped or adjusted to overcome the gain mismatching issue.

To achieve the above object, another exemplary embodiment of the invention provides a PLL device comprising: a phase detection device coupled to an input data signal and a clock signal to detect the phase difference between the input data signal and the clock signal and output a first up-index (UP1) or a first down-index (DN1); a probability shaping device coupled to the output of the phase detection device to process the first up-index and first down-index and output a second up-index (UP2) or a second down-index (DN2); a charge pump and loop filter (CPLF) device coupled to the probability shaping device to output and adjust a control voltage according to the second up-index or second down-index received by the CPLF device; and a voltage control oscillator coupled to the control voltage to change frequency or phase of the clock signal according to the control voltage and output the clock signal to the phase detection device. It is noted that the probability shaping device is designed to make the occurring frequency of the second up-index UP2 and second down-index DN2 are respectively less than that of the first up-index UP1 and first down-index DN1, whereby the distribution of the expected values (E(UP2) and E(DN2)) corresponding to the phase position detected by the phase detection device is well shaped or adjusted and the gain mismatching issue is overcome.

A detailed description is given in the following embodiments with reference to the accompanying drawings.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
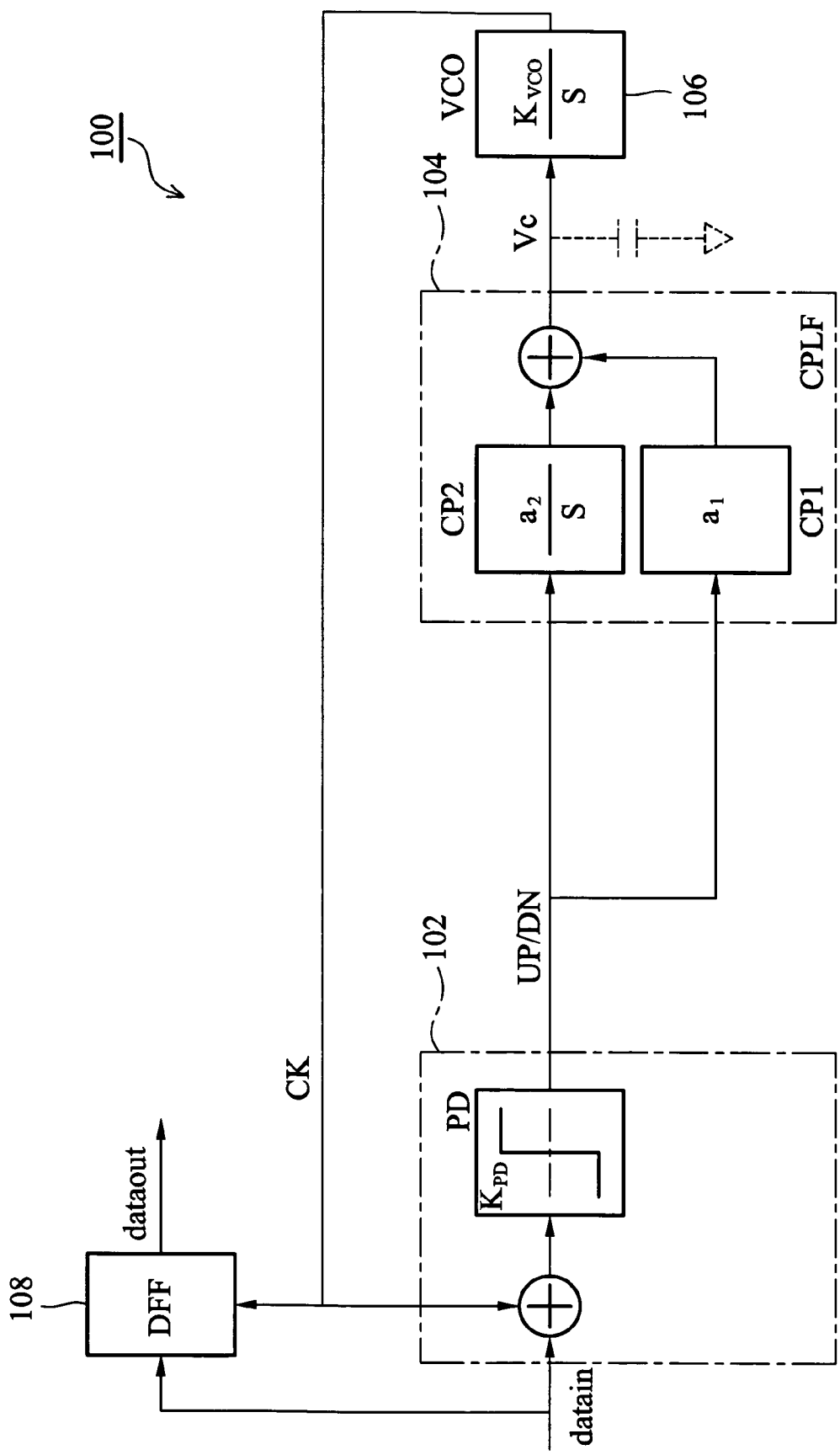
FIG. 1 is a function block diagram showing a conventional phase lock loop device for carrying out data clock recovery.

Please refer to FIG. 1 to consider influence on the CPLF device 104 due to latency or delay. The CPLF device 104 comprises a proportional path CP1 and integration path CP2 with functions or characteristics described as transfer functions of $a_1$ and $a_2/S$ respectively, wherein $a_1$ and $a_2$ are constants. Assuming that operating frequency is $\omega$, the amplitude of the output signal of the CPLF device 104 is equal to 1, and $\omega=10\omega_z$, $\omega=0.01\omega_0$, here $\omega_0$ is the frequency of the clock signal CK.

Assume latency or delay is 5 clocks for example. Thus the phase lag is $$\theta = \frac{\omega}{\omega_0} \cdot 5 \cdot 2\pi = 18°.$$

The transfer function of the CPLF device 104 is $$a_1 + \frac{a_2}{S} = \frac{a_2}{S}\left(\frac{S}{\omega_z} + 1\right) = \frac{a_2}{S}\left(j\frac{\omega}{\omega_z} + 1\right).$$

As to the item $$j\frac{\omega}{\omega_z} + 1$$

in the transfer function, the phase of the item is $$\phi = \tan^{-1}\frac{\omega}{\omega_z} = 84.3°$$

and the amplitude of the item is $$A = \sqrt{\left(\frac{\omega}{\omega_z}\right)^2 + 1} = 10.05.$$

Consider the following situations <1> and <2>.

<1> Assume that a phase lag $\theta$ occurs at the proportional path CP1 of the CPLF device 104. An item $$j\frac{\omega}{\omega_z} + 1$$

in the transfer function becomes $$j\frac{\omega}{\omega_z}\angle\theta + 1 = j\frac{\omega}{\omega_z}\cos\theta + \left(\frac{\omega}{\omega_z}\sin\theta + 1\right),$$

wherein the phase of the item is $$\phi = \tan^{-1}\left(\frac{\frac{\omega}{\omega_z}\cos\theta}{1 + \frac{\omega}{\omega_z}\sin\theta}\right) = 66.7$$

and the amplitude of the item is $$A = \sqrt{\left(\frac{\omega}{\omega_z}\right)^2 + 1 + 2\frac{\omega}{\omega_z}\sin\theta} = 10.35.$$

<2> Assume that a phase lag $\theta$ occurs at the integration path CP2 of the CPLF device 104. The item $$j\frac{\omega}{\omega_z} + 1$$

in the transfer function becomes $$j\frac{\omega}{\omega_z} + 1\angle\theta = j\left(\frac{\omega}{\omega_z} - \sin\theta\right) + \frac{\omega}{\omega_z}\cos\theta,$$

wherein the phase of the item is $$\phi = \tan^{-1}\left(\frac{\frac{\omega}{\omega_z} - \sin\theta}{\cos\theta}\right) = 84.4°$$

and the amplitude of the item is $$A = \sqrt{\left(\frac{\omega}{\omega_z}\right)^2 + 1 - 2\frac{\omega}{\omega_z}\sin\theta} = 9.74.$$

According to above analysis of <1> and <2>, it is concluded that the latency in the proportional path CP1 degrades the open-loop phase margin of the CPLF device 104, and the latency in the integration path CP2 have almost no influence on the open-loop phase margin of the CPLF device 104.

Figure 2:
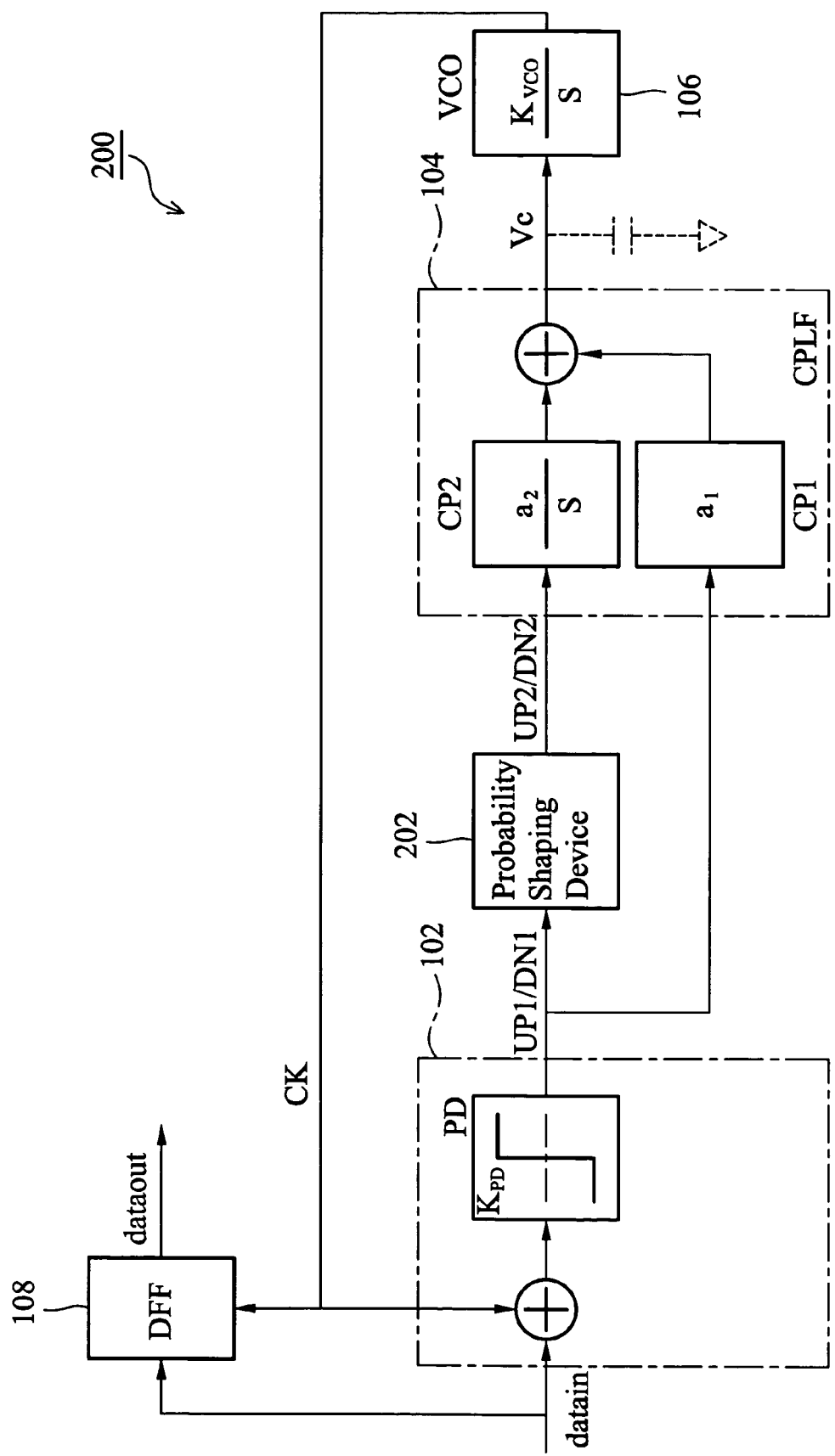
FIG. 2 is a function block diagram showing a phase lock loop device for carrying out data clock recovery according to one embodiment of the invention.

FIG. 2 is a function block diagram showing a phase lock loop (PLL) device 200 for carrying out data clock recovery according to one embodiment of the invention. In FIG. 2, the devices or signals similar with those shown in FIG. 1 are represented by the same symbols or numerals, and descriptions for the same devices described in FIG. 1 are omitted for brevity.

The PLL device 200 comprises a phase detection (PD) device 102, a charge pump and loop filter (CPLF) device 104, a voltage control oscillator (VCO) 106 and a D-type flip-flop (DFF) 108 and a probability shaping device 202.

The CPLF device 104 comprises a charge pump and a loop filter (neither of which are shown in FIG. 2), implemented by current switches, resistors, capacitors or active devices. Similarly, the function of the CPLF device 104 can be analyzed as a combination of a proportional path CP1 and an integration path CP2, and the combination may be an addition operation. In this embodiment, the probability shaping device 202 is disposed between the phase detection device 102 and the CPLF device 104, with its output coupled to the integration path CP2 of the CPLF device 104. The proportional path CP1 of the CPLF device 104 is coupled to the output of the phase detection device 102.

The phase detection device 102 detects the phase difference between a input data signal datain and a clock signal CK to output a first up-index UP1 or a first down-index DN1. Generally, the clock signal CK general is fed back from the voltage control oscillator to the phase detection device 102 through a divided-by-N device (not shown in FIG. 2), and here the divided-by-N device is supposed to carry out a divided-by-one operation for brevity, but is not limited to this.

The probability shaping device 202 receives the first up-index UP1 or first down-index DN1, processing the first up-index UP1 and first down-index DN1 to output a second up-index UP2 or a second down-index DN2 according to the processing result such that the frequency of outputting the second up-index UP2 or the second down-index DN2 is less than that of outputting the first up-index UP1 or the first down-index DN1 from the phase detection device 102. Alternatively, the probability shaping device 202 is designed to generate a second up-index UP2 and a second down-index DN2 and reducing the expected values (E(UP2), E(DN2)) of the second up-index UP2 and second down-index DN2 when the probability (P(UP1)) of outputting the first up-index is substantially equal to or approximates the probability (P(DN1)) of outputting the first down-index DN1.

The probability shaping device 202 can be implemented using a digital filter, but is not limited to this. The digital filter subtracts the occurrence number or pulse number of the first up-index UP1 and that of the first down-index DN1, and scales down the subtracted result to reducing the occurrence frequency or number of the second up-index UP2 and second down-index DN2. Alternatively, the digital filter respectively scales down the occurrence number or pulse number of the first up-index UP1 and that of the first down-index DN1, and then subtracts the two down-scaled results, thereby generating the second up-index UP2 and second down-index DN2 and reducing the frequency or number of outputting the second up-index UP2 and second down-index DN2 from the digital filter (the probability shaping device).

Figure 3:
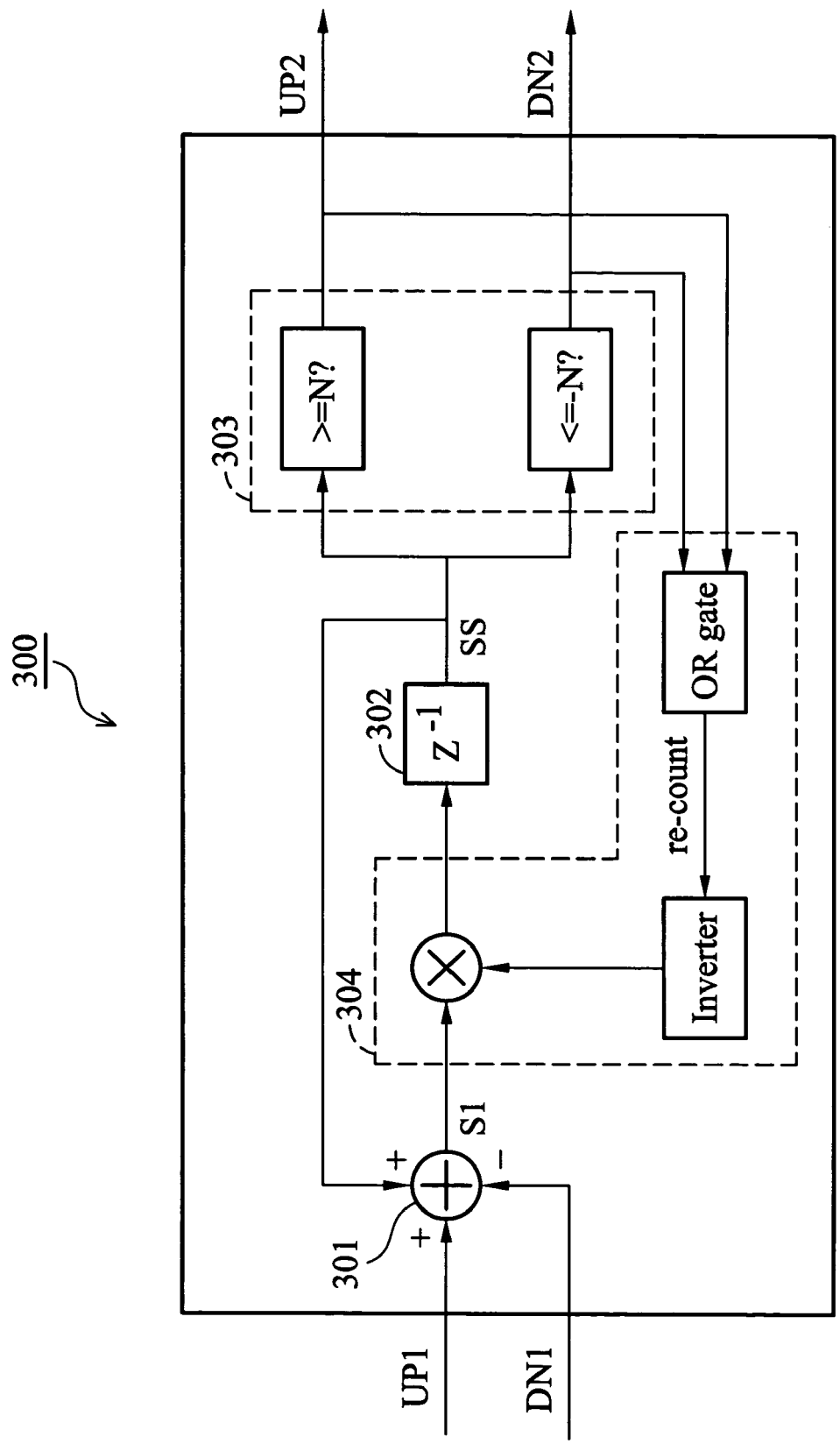
FIG. 3 shows an exemplary embodiment of a digital filter for implementing the probability shaping device according to the invention.

FIG. 3 is an exemplary embodiment showing a digital filter for implementing the probability shaping device according to the invention. In FIG. 3, the digital filter 300 operates as a divided-by-N circuit. The digital filter 300 comprises an operation device 301, a delay unit and a decision device 303.

The operation device 301, such as an adder, adds one to an account result SS when the phase detection device 102 outputs the first up-index UP1, and subtracts one from the account result SS when the phase detection device 102 outputs the first down-index DN1. The account result SS corresponds to the continuous occurrence number of the first up-index UP1 or the first down-index DN1 (outputted from the phase detection device 102).

The delay unit 302, coupled to the operation device 301, receives and delays the output S1 of the operation device 301 to provide the account result SS.

The decision device 303, coupled to the output of the delay unit 302, outputs the second up-index UP2 when the account result SS is greater than or equal to a positive integer N, and outputs the second down-index DN2 when the account result SS is less than or equal to a negative integer −N.

The digital filter 300 further comprises a reset unit 304 which is disposed between the operation device 301 and the delay unit 302 and controlled by the decision device 303. The reset unit 304 resets the account result SS when the decision device 304 outputs the second up-index UP2 or second down-index DN2. Here, the reset unit 304 includes a multiplier, an inverter and an OR gate. When the decision device 303 outputs the second up-index UP2 or second down-index DN2, the decision device 303 will drive the OR gate to output a logic 1 as a reset signal (re-count) and make the inverter output a logic 0 to the multiplier, thereby resetting the account result SS.

Figure 12:
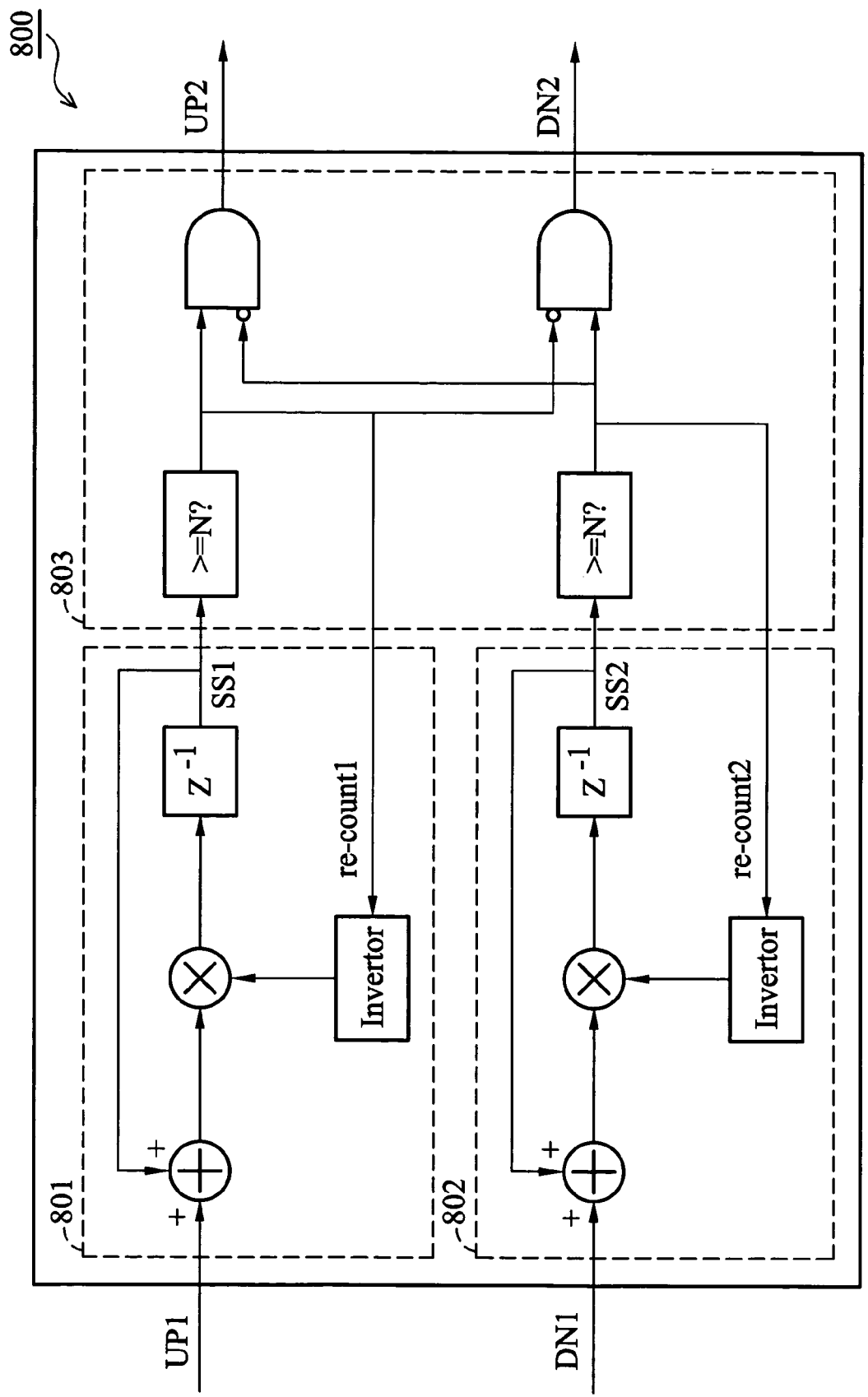
FIG. 12 is another exemplary embodiment showing another digital filter for implementing the probability shaping device according to the invention.

FIG. 12 is another exemplary embodiment showing another digital filter for implementing the probability shaping device according to the invention. In FIG. 12, the digital filter 800 also operates as a divided-by-N circuit. The digital filter 800 comprises a first accumulating device 801, a second accumulating device 802 and a decision device 803.

The first accumulating device 801 adds one to a first accumulating value SS1 when the phase detection device 102 outputs the first up-index UP1, wherein the first accumulating value SS1 corresponds to the occurrence number of the first up-index UP1. The second accumulating device 802 adds one to a second accumulating value SS2 when the phase detection device 102 outputs the first down-index DN1, wherein the second accumulating value SS2 corresponds to the occurrence number of the first down-index DN1.

Both the first accumulating device 801 and second accumulating device 802 include a adder, a multiplier, an inverter and a delay unit, and their operations are the same as that described in FIG. 3. The inverter and multiplier are utilized to reset the first or second accumulating value.

The decision device 803, coupled to the first accumulating device 801 and second accumulating device 802, outputs the second up-index UP2 when the first accumulating value SS1 is greater than or equal to a positive integer N, and outputs the second down-index DN2 when the second accumulating value SS2 is greater than or equal to the positive integer N.

Figure 4:
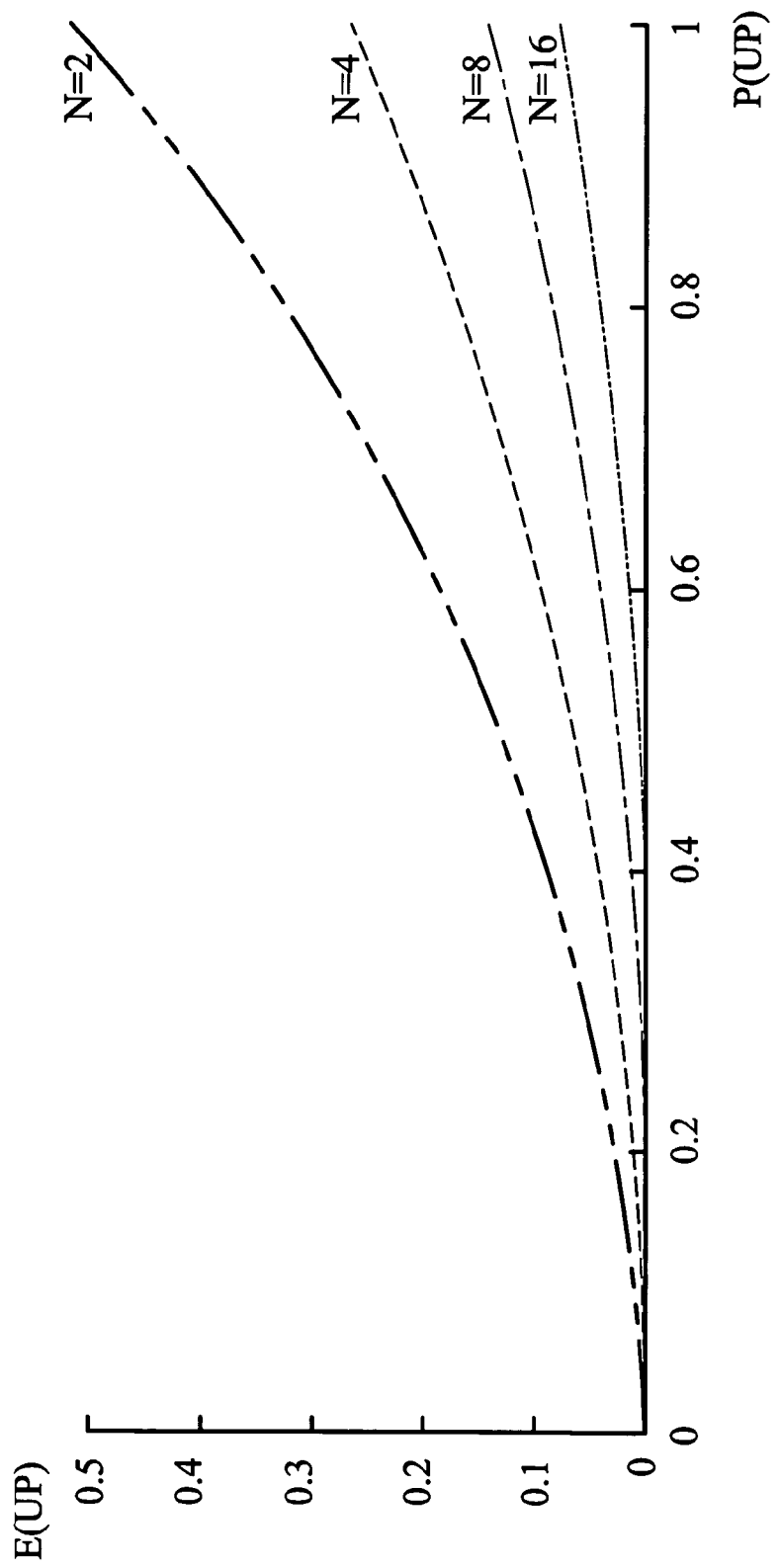
FIG. 4 shows the relationship between the expected value E(UP) of the second up-index UP2 output from the probability shaping device 202 and the probability P(UP) of outputting the first up-index UP1 from the phase detection device 102.
Figure 5:
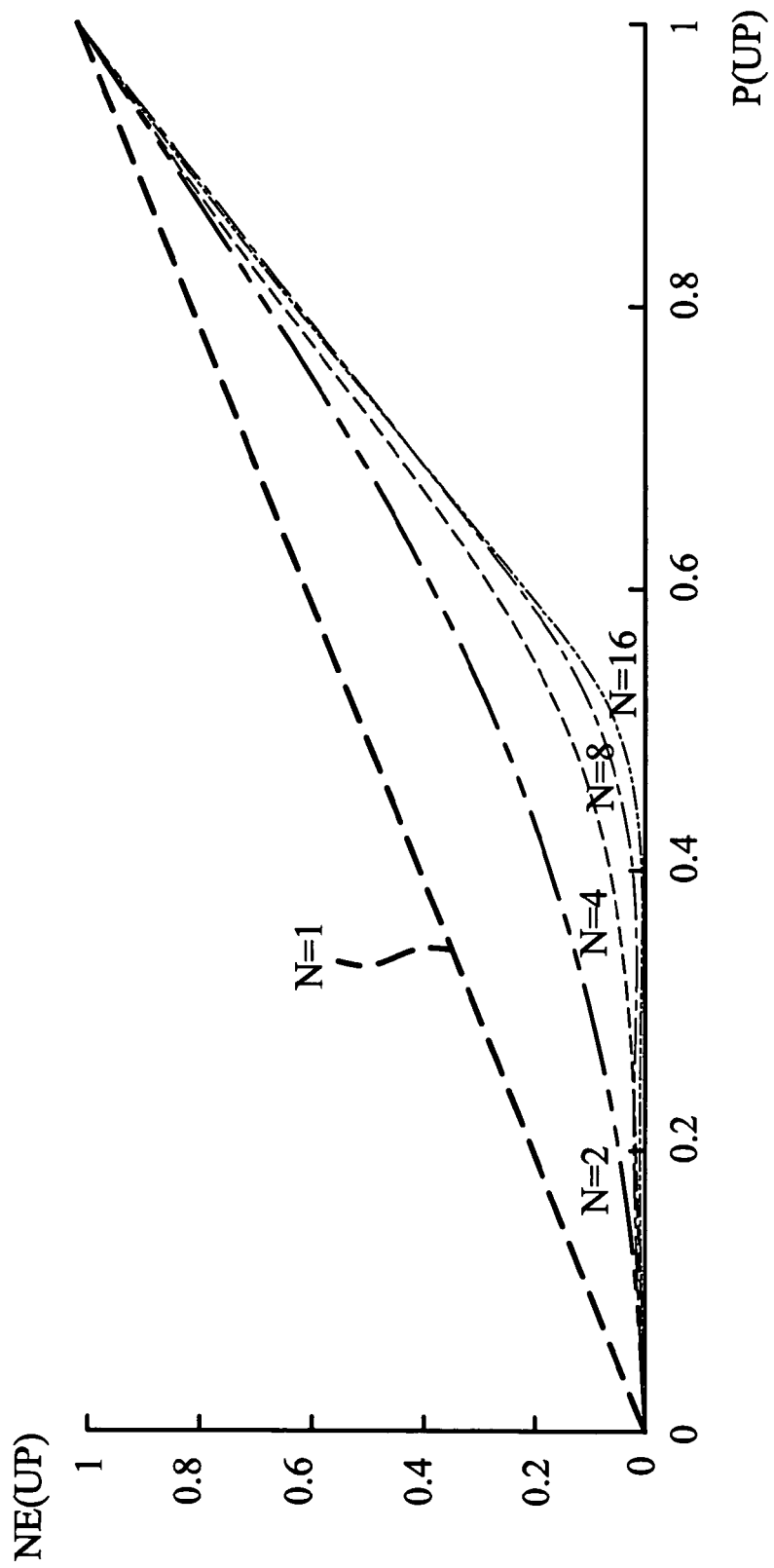
FIG. 5 shows the relationship between the normalized expected value NE(UP) of the second up-index UP2 and the probability P(UP) of outputting the first up-index UP1.

FIG. 4 shows the relationship between the expected value E(UP) of the second up-index UP2 outputted from the probability shaping device 202 and the probability P(UP) of outputting the first up-index UP1 from the phase detection device 102. Integer N means the divisor of the digital filter (divided-by-N circuit) implementing the probability shaping device 202. FIG. 5 shows the relationship between the normalized expected value NE(UP) of the second up-index UP2 and the probability P(UP) of outputting the first up-index UP1. For each phase detecting, the probability P(UP) means the probability that the phase detection device 102 outputs the first up-index UP1, for example outputting UP1 equal to 1; and the probability P(DN), not shown in FIGS. 4 and 5, means the probability that the phase detection device 102 outputs the first down-index DN1, for example outputting DN1 equal to 1. It is noted that P(UP)+P(DN) is equal to 1. E(UP) is the expected value when the probability shaping device outputs the second up-index UP2 (for example equal to 1), and E(DN) (not shown in FIGS. 4 and 5) is the expected value when the probability shaping device outputs the second down-index DN2 (for example equal to 1), here NE(UP)=N×E(UP), NE(DN)=N×E(DN).

Figure 6:
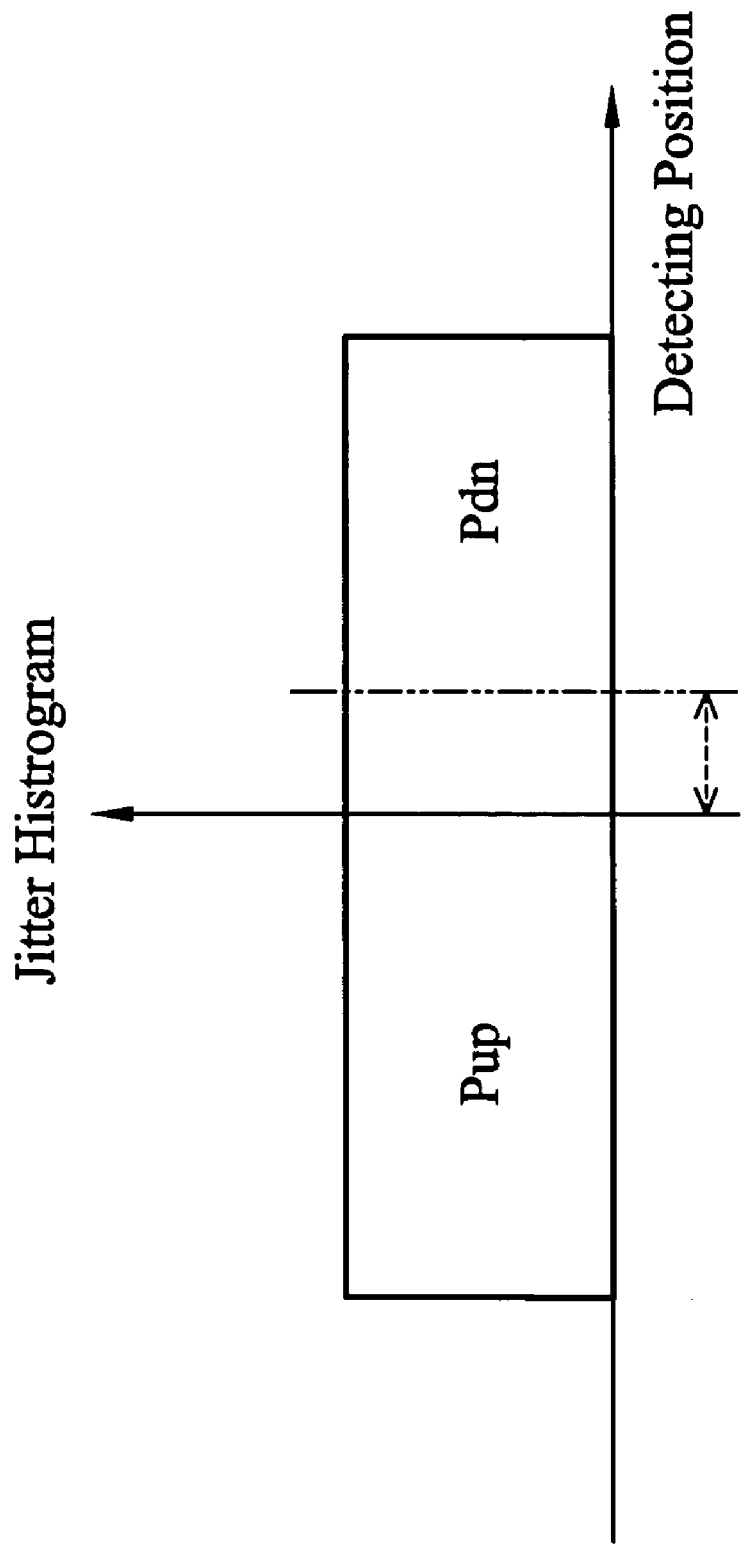
FIG. 6 is a jitter histogram with respect to the phase position detected by phase detection device.
Figure 7:
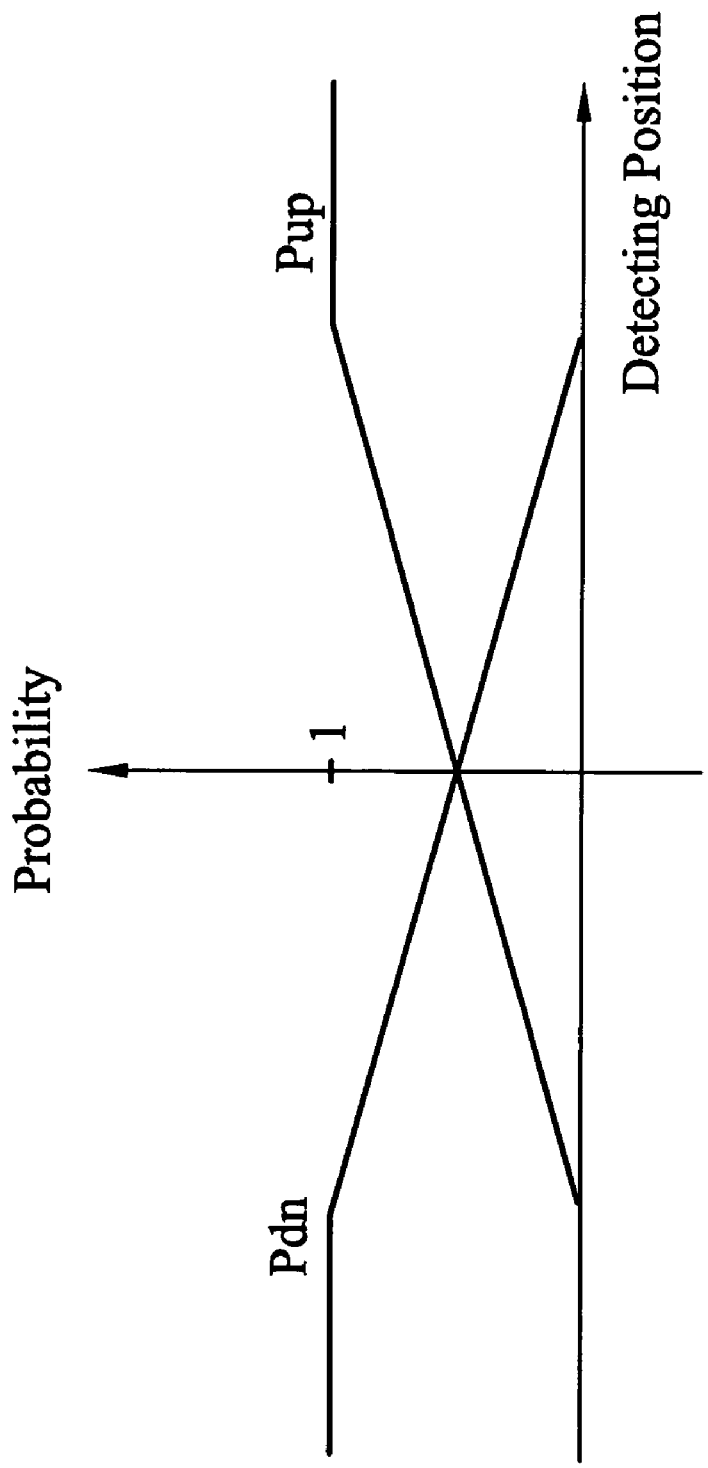
FIG. 7 shows the relationship of occurrence probability (Pup, Pdn) of the up-index and down-index corresponding to the position detected by the phase detection device.
Figure 8:
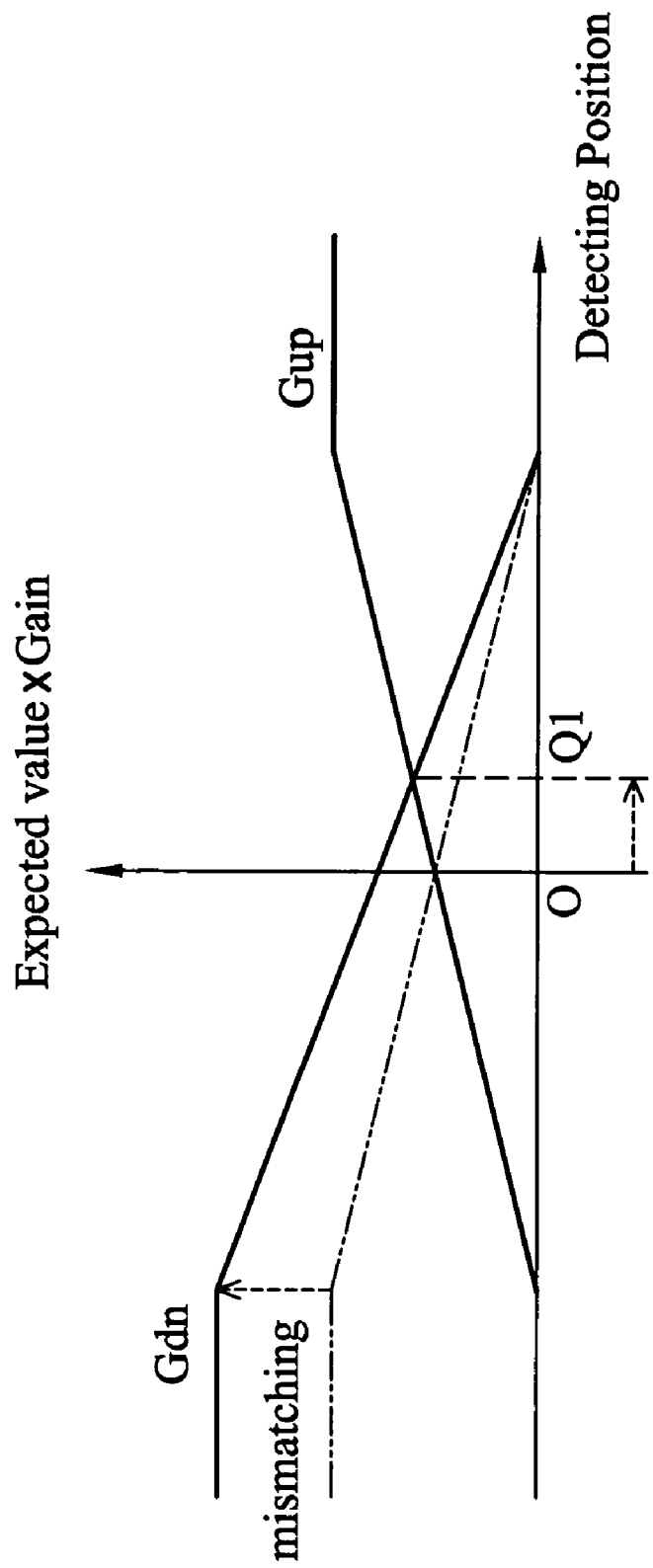
FIG. 8 shows a relationship of a product Gup (or Gdn) corresponding to the phase position detected by the phase detection device, of a conventional PLL device.

FIG. 6 is a jitter histogram with respect to the phase position detected by phase detection device. Here, the jitter distribution of the phase difference detected by the phase detection device is uniform random distribution. The probability Pup (or Pdn) of outputting up-index (or down-index) from the phase detection device is proportional to the detected phase position of the feed-back clock signal, as shown in FIG. 7. FIG. 8 shows a relationship of a product Gup (or Gdn) corresponding to the phase position detected by the phase detection device, wherein the product Gup (or Gdn) is the expected values of the up-index (or down-index) outputted from the phase detection device multiplied by the gain of the charge pump (the stage next to the phase detection device). Non-ideal locking of a conventional PLL device is inevitable due to gain mismatch of charge pump, and therefore the predetermined locking position O deviates to the non-ideal locking position Q1, as shown in FIG. 8.

Figure 9:
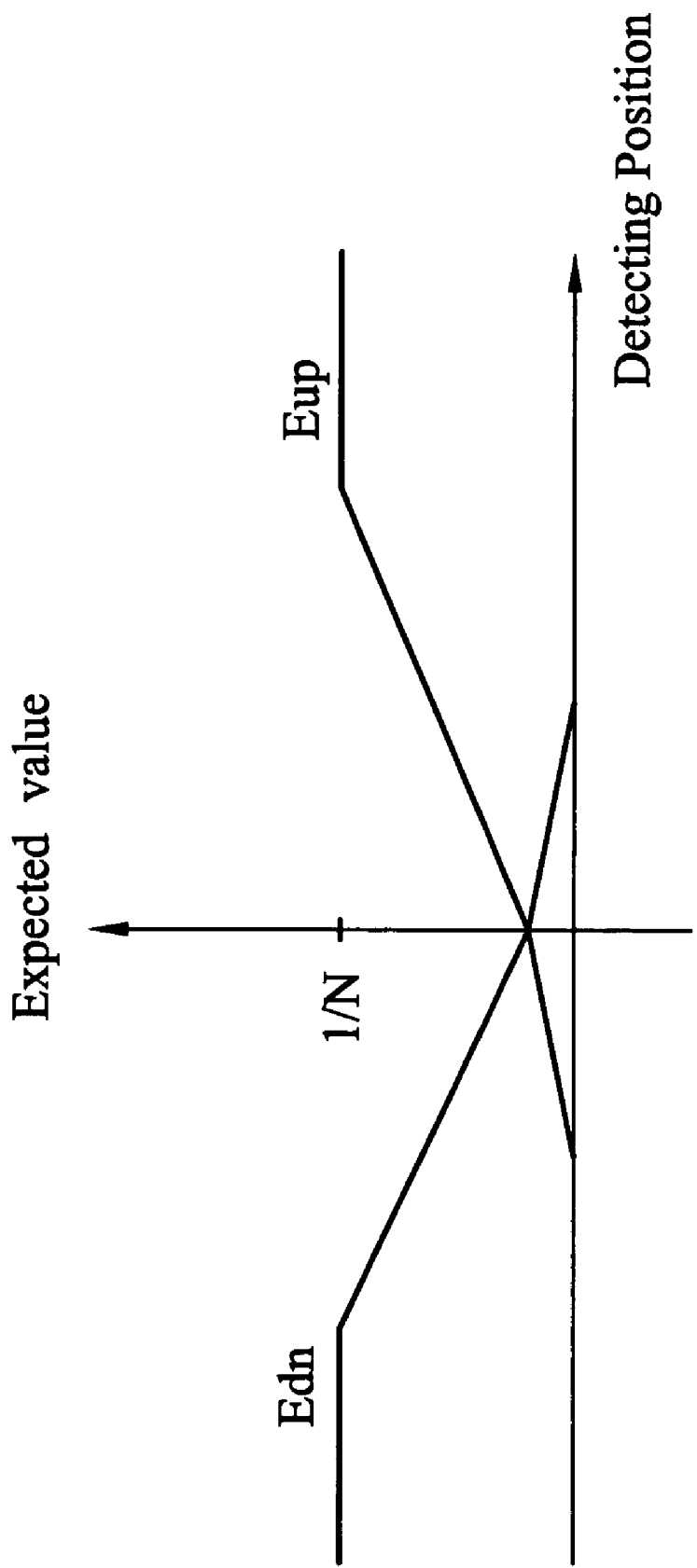
FIG. 9 shows the relationship of the expected values (Eup, Edn) corresponding to the position detected by the phase detection device.
Figure 10:
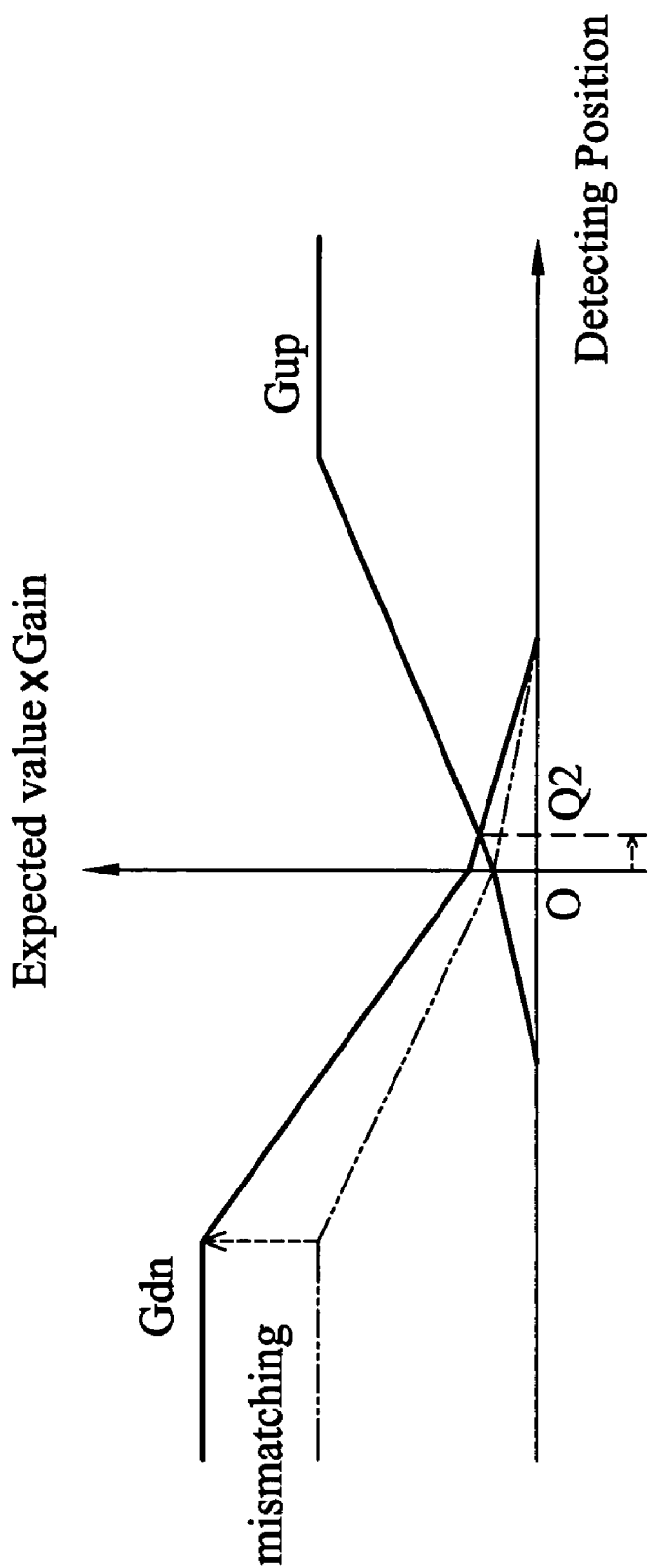
FIG. 10 shows a relationship of a product Gup (or Gdn) corresponding to the phase position detected by the phase detection device, according to the invention.

A probability shaping device is further provided to the PLL device according to the invention. The probability shaping device can be implemented using a digital filter, operating as a divided-by-N circuit such that the expected values Eup and Edn of the up-index and down-index are divided by N, or the distribution of the expected values Eup and Edn is shaped and adjusted, as shown in FIG. 9. Consequently, the distribution of products Gup and Gdn are also shaped and scaled down, as shown in FIG. 10. In FIG. 10, the locking position only deviates from position O to Q2, and therefore the issue of non-ideal locking is well improved when compared with the conventional PLL (FIG. 8).

Figure 11:
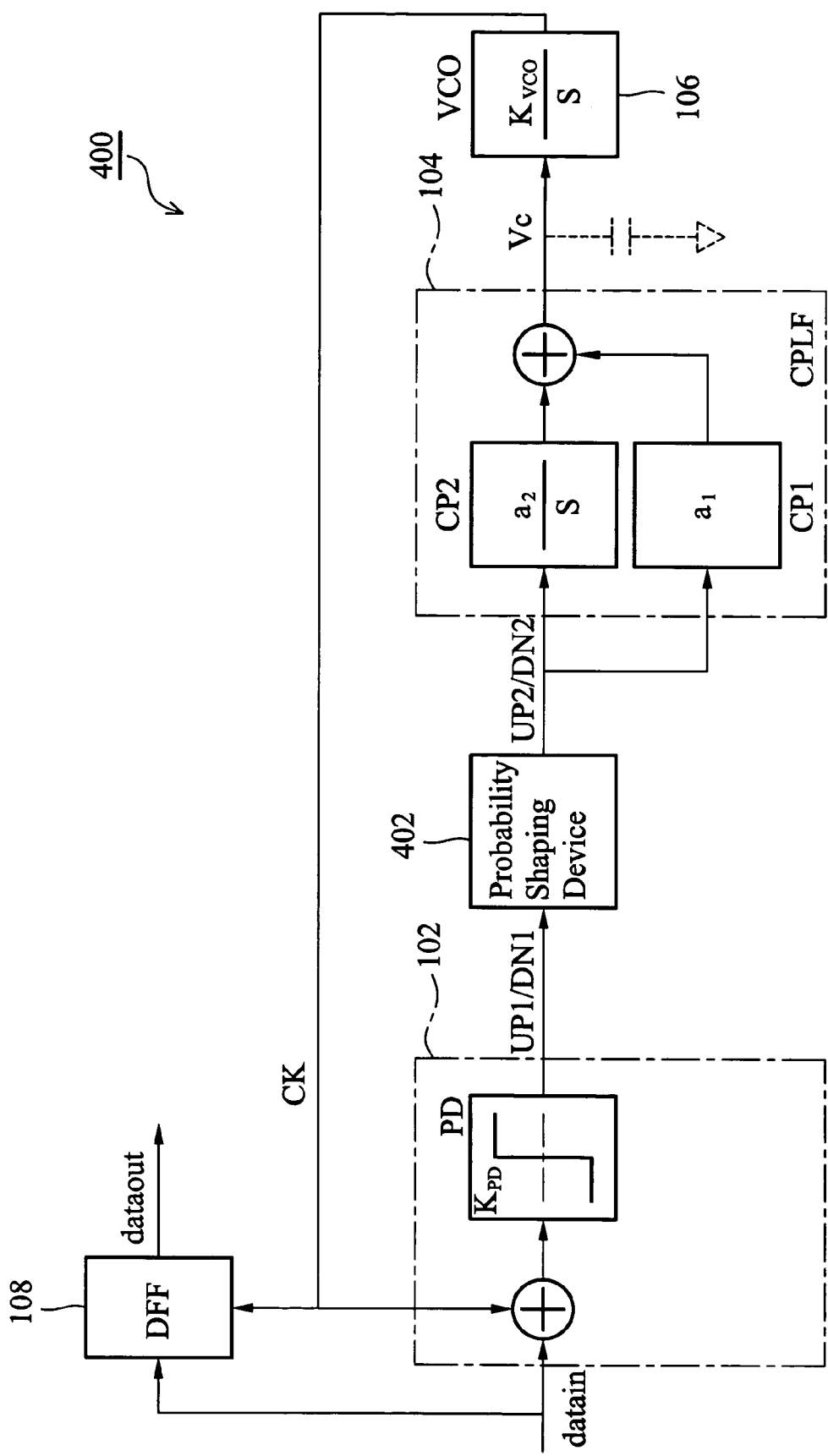
FIG. 11 is a function block diagram showing a phase lock loop device for carrying out data clock recovery according to another embodiment of the invention.

In addition, latency or delay due to the probability shaping device will not degrade performance of the PLL device when the input data signal datain is a low data rate. Therefore, the probability shaping device 402 also can be disposed between the phase detection device 102 and the CPLF device 104, and its output is coupled to the proportional path CP1 and the integration path CP2 of the CPLF device 104, as shown in FIG. 11.

Similarly, the probability shaping device 402 can be implemented by a digital filter but not limited to this. The digital filter carries out a subtraction to the occurrence numbers (or pulse numbers) of the first up-index UP1 and first down-index DN1 and scales down the subtracting result to lower the output frequency (or number) of the second up-index UP2 and second down-index DN2. Alternatively, the digital filter respectively scales down the occurrence number or pulse number of the first up-index UP1 and that of the first down-index DN1, and then subtracts the two down-scaled results, thereby generating the second up-index UP2 and second down-index DN2 and reducing the frequency or number of outputting the second up-index UP2 and second down-index DN2 from the digital filter (the probability shaping device). The probability shaping device 402 can be implemented by the digital filters shown in FIGS. 3 and 12.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase lock loop device, comprising:
    a phase detection device coupled to an input data signal and a clock signal to detect the phase difference between the input data signal and the clock signal and output a first up-index or a first down-index;
    a probability shaping device coupled to the output of the phase detection device to process the first up-index and first down-index and output a second up-index or a second down-index according to the processing result such that the frequency of outputting the second up-index or the second down-index is less than that of outputting the first up-index or the first down-index output from the phase detection device;
    a charge pump and loop filter (CPLF) device coupled to the probability shaping device to output and adjust a control voltage according to the second up-index or second down-index received by the CPLF device; and
    a voltage control oscillator coupled to the control voltage to change frequency or phase of the clock signal according to the control voltage and output the clock signal to the phase detection device;
    wherein the probability shaping device monitors the occurrence number that the first up-index and first down-index is output, and outputs the second up-index when the occurring number of the first up-index is greater than or equal to a first value and outputs the second down-index when the occurrence number of the first down-index is greater than or equal to a second value and the probability shaping device comprises:
    an operation device coupled to the phase detection device, performing an addition to an account result when the phase detection device outputs the first up-index and performing a subtraction to the account result when the phase detection device outputs the first down-index;
    a delay unit coupled to the output of the operation device, delaying the output of the operation device to generate and output the account result to the operation device; and
    a decision device coupled to the output of the delay unit, outputting the second up-index when the account result is greater than or equal to a positive integer and outputting the second down-index when the account result is less than or equal to a negative integer.

2. The phase lock loop device as claimed in claim 1, wherein the probability shaping device further comprises a reset unit which is disposed between the operation device and the delay unit and controlled by the decision device to reset the account result when the decision device outputs the second up-index or second down-index.

3. The phase lock loop device as claimed in claim 1, wherein the CPLF device comprises:
    a proportional path with an input coupled to the output of the phase detection device or that of the probability shaping device;

an integration path with an input coupled to the output of the proportional path; and an adder receiving the outputs of the proportional path and the integration path and outputting the control voltage.

4. The phase lock loop device as claimed in claim 3, wherein the integration path comprises an integrator and the proportional path comprises a proportional operation device.

5. The phase lock loop device as claimed in claim 4, further comprising a D-type flip-flop coupled to the clock signal and the input data signal and outputting an output data signal according to the clock signal.

6. A phase lock loop device, comprising:

a phase detection device coupled to an input data signal and a clock signal to detect the phase difference between the input data signal and the clock signal and output a first up-index or a second down-index;

a probability shaping device coupled to the output of the phase detection device to generate a second up-index and a second down-index and to reduce the expected values of the second up-index and second down-index when the probability that the phase detection device outputs the first up-index is substantially equal to that of outputting the first down-index;

a charge pump and loop filter (CPLF) device coupled to the probability shaping device to output and adjust a control voltage according to the second up-index or second down-index received by the CPLF device; and a voltage control oscillator coupled to the control voltage to change frequency or phase of the clock signal according to the control voltage and output the clock signal to the phase detection device;

wherein the probability shaping device monitors the numbers that the first up-index and first down-index are output, and outputs the second up-index when the output number of the first up-index is greater than or equal to a first value and outputs the second down-index when the output number of the first down-index is greater than or equal to a second value; and wherein the probability shaping device comprises:

an operation device coupled to the phase detection device, performing an addition to an account result when the phase detection device outputs the first up-index and performing a subtraction to the account result when the phase detection device outputs the first down-index;

a delay unit coupled to the output of the operation device, delaying the output of the operation device to generate and output the account result to the operation device; and a decision device coupled to the output of the delay unit, outputting the second up-index when the account result is greater than or equal to a positive integer and outputting the second down-index when the account result is less than or equal to a negative integer.

7. The phase lock loop device as claimed in claim 6, wherein the probability shaping device further comprises a reset unit which is disposed between the operation device and the delay unit and controlled by the decision device to reset the account result when the decision device outputs the second up-index or second down-index.

8. The phase lock loop device as claimed in claim 6, wherein the probability shaping device comprises:

a first accumulating device coupled to the output of the phase detection device to obtain a first accumulating value corresponding to the outputting number of the first up-index;

a second accumulating device coupled to the output of the phase detection device to obtain a second accumulating value corresponding to the outputting number of the first down-index; and a decision device coupled to the first and second accumulating devices, outputting the second up-index when the first accumulating value is greater than or equal to a first value and outputting the second down-index when the second accumulating value is greater than or equal to the first value.

9. The phase lock loop device as claimed in claim 8, further comprising at least a reset unit controlled by the decision device to reset the first or second accumulating value when the decision device outputs the second up-index or second down-index.

10. A phase lock loop device, comprising:

a phase detection device coupled to an input data signal and a clock signal to detect the phase difference between the input data signal and the clock signal and output a first up-index or a first down-index;

a probability shaping device coupled to the output of the phase detection device to process the first up-index and first down-index and output a second up-index or a second down-index according to the processing result such that the frequency of outputting the second up-index or the second down-index is less than that of outputting the first up-index or the first down-index output from the phase detection device;

a charge pump and loop filter (CPLF) device coupled to the probability shaping device to output and adjust a control voltage according to the second up-index or second down-index received by the CPLF device; and a voltage control oscillator coupled to the control voltage to change frequency or phase of the clock signal according to the control voltage and output the clock signal to the phase detection device;

wherein the probability shaping device monitors the occurrence number that the first up-index and first down-index is output, and outputs the second up-index when the occurring number of the first up-index is greater than or equal to a first value and outputs the second down-index when the occurrence number of the first down-index is greater than or equal to a second value and the probability shaping device comprises:

a first accumulating device coupled to the output of the phase detection device to obtain a first accumulating value corresponding to the occurrence number of the first up-index;

a second accumulating device coupled to the output of the phase detection device to obtain a second accumulating value corresponding to the occurrence number of the first down-index; and a decision device coupled to the first and second accumulating devices, outputting the second up-index when the first accumulating value is greater than or equal to a first value and outputting the second down-index when the second accumulating value is greater than or equal to the first value.

11. The phase lock loop device as claimed in claim 10, further comprising at least a reset unit controlled by the decision device to reset the first or second accumulating value when the decision device outputs the second up-index or second down-index.

* * * * *